United States Patent [19]

Tada et al.

[11] Patent Number: 4,961,052
[45] Date of Patent: Oct. 2, 1990

[54] PROBING PLATE FOR WAFER TESTING

[75] Inventors: Tetsuo Tada; Ryoichi Takagi; Masanobu Kohara, all of Hyogo, Japan

[73] Assignee: Mitsubishi Denki Kabushiki Kaisha, Tokyo, Japan

[21] Appl. No.: 380,427

[22] Filed: Jul. 17, 1989

[30] Foreign Application Priority Data

Jan. 7, 1989 [JP] Japan ................................. 1-1623

[51] Int. Cl.⁵ .......................... G01R 31/02; G01R 1/06
[52] U.S. Cl. .............................. 324/158 P; 324/158 F
[58] Field of Search ........... 324/158 P, 158 F, 73 PC, 324/72 S, 73 AT, 158 R; 437/8; 439/482

[56] References Cited

U.S. PATENT DOCUMENTS

| | | | |
|---|---|---|---|
| 3,445,770 | 5/1969 | Harmon | 324/158 P |
| 3,810,016 | 5/1974 | Chayka et al. | 324/158 F |
| 4,585,991 | 4/1986 | Reid et al. | 324/73 PC |
| 4,649,338 | 3/1987 | Dugan | 324/158 P |
| 4,649,339 | 3/1987 | Grangroth et al. | 324/158 F |

FOREIGN PATENT DOCUMENTS

| | | | |
|---|---|---|---|
| 1910314 | 10/1970 | Fed. Rep. of Germany | 324/158 P |
| 58-162045 | 7/1983 | Japan . | |
| 59-11640 | 9/1984 | Japan . | |
| 59-144142 | 11/1984 | Japan . | |
| 0109334 | 5/1987 | Japan | 324/158 P |
| 0147374 | 6/1989 | Japan | 324/158 P |

OTHER PUBLICATIONS

"Membrane Probe Card Technology", by Leslie et al., 1988, International Test Conference, Paper No. 30.1.

Primary Examiner—Ernest F. Karlsen
Assistant Examiner—Vinh P. Nguyen
Attorney, Agent, or Firm—Lowe, Price, LeBlanc, Becker & Suhr

[57] ABSTRACT

A probing plate for wafer testing is provided with a plurality of probes arranged so as to correspond to a plurality of bonding pads of semiconductor devices fabricated on a semiconductor wafer. The probing plate has a base plate formed of an insulating material, such as a photosensitive glass, and has contact fingers each having a raised portion in the free end thereof, contact conductors respectively formed on the surfaces of the raised portions of the contact fingers so as to be brought into contact with the corresponding bonding pads, and wiring conductors formed in a predetermined pattern on the surface of the base plate so as to extend respectively from the contact conductors. The contact conductors and the wiring conductors are formed simultaneously by a photolithographic process. The contact fingers and the raised portions thereof are also formed by subjecting the base plate to a photolithographic process. Forming the contact conductors over the surfaces of the raised portions of the contact fingers prevents accidental contact of the contact conductors with the bonding pads of semiconductor devices other than the objective semiconductor devices.

8 Claims, 10 Drawing Sheets

FIG.7A
FIG.7B
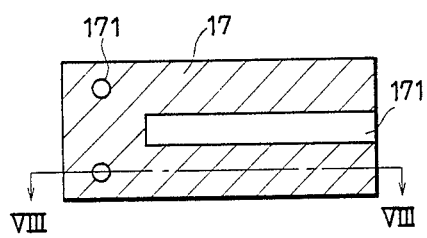
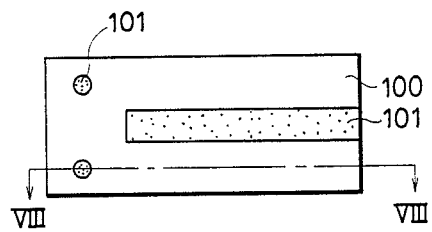
FIG.8A
FIG.8B
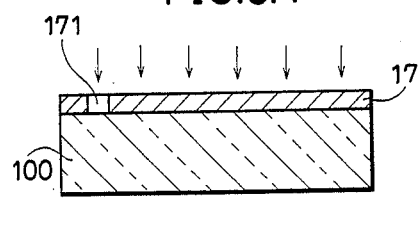
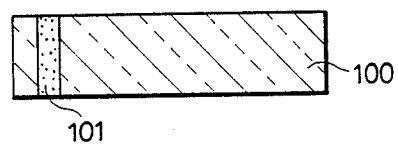
FIG.7C
FIG.7D
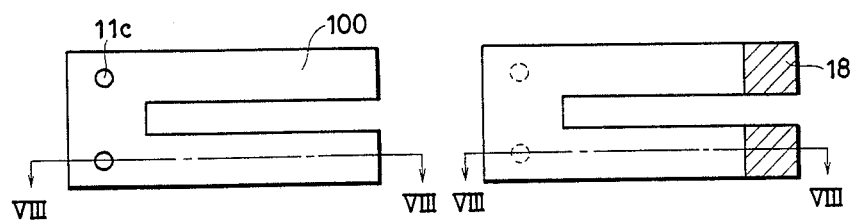
FIG.8C
FIG.8D
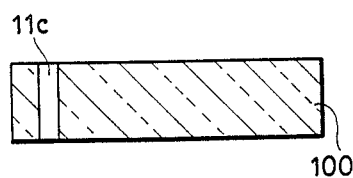
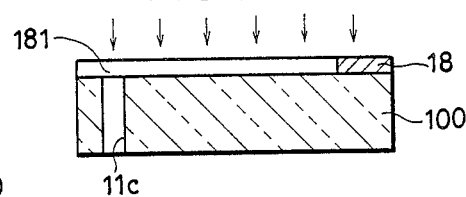

PROBING PLATE FOR WAFER TESTING

BACKGROUND OF THE INVENTION

1. Field of the Invention

The present invention relates to a probing plate for wafer testing and, more particularly, to a probing plate for wafer testing having a plurality of probes arranged so as to correspond to a plurality of electrodes of a semiconductor device (semiconductor chip) fabricated on a semiconductor wafer.

2. Description of the Background Art

Generally, a checking equipment (hereinafter, referred to as "wafer prober") for measuring the electrical characteristics of a semiconductor device formed on a semiconductor wafer in a semiconductor integrated circuit (IC) manufacturing process employs a probing plate. The probing plate is formed by fixedly arranging probes in a pattern corresponding to that of the electrodes, i.e., the bonding pads or solder bumps, of the semiconductor device on an insulating holding plate.

A conventional wafer tester will be described with reference to FIG. 9A showing a conventional probing plate for wafer testing incorporated into a wafer prober and FIG. 9B showing probes in contact with bonding pads formed on a wafer.

A wafer 1 mounted with a plurality of semiconductor device, such as LSIs (large-scale integrated circuits) is fixed on a wafer chuck 8. The wafer chuck 8 can be moved vertically and horizontally by a moving mechanism 9. A large number on the order of several hundreds of bonding pads 2 are formed on the upper surface of the wafer 1 for each semiconductor chip. Slender probes 3 are arranged and held on a probe holding plate 4 so as to correspond to the bonding pads 2, respectively. The probe holding plate 4 is positioned above the wafer 1. The probes 3 are formed of tungsten, chromium or a tungsten-chromium alloy. The probe holding plate 4 is formed of an insulating material, such as glass or an epoxy resin. A conductive pattern 5 is formed of a metal, such as copper over one surface of the probe holding plate 4, and the probes 3 are connected electrically to the conductive pattern 5 by soldering or the like. The size of the contact area of the electrode pads 2 with which the tip of the probe 3 is brought into contact is in the range of about 50 to about 100 $\mu$m in diameter. The external diameter of the base of the probe 3 connected to the probe holding plate 4 is in the range of about 150 to about 200 $\mu$m. A conductive pattern 5, which is the same as the conductive pattern 5 connected to the proves 3, is formed on the other surface of the probe holding plate 4 and is connected through through holes to the former conductive pattern 5. The conductive pattern 5 is in electrical contact with contact pins (hereinafter, referred to as "pogo pins") 7 provided on the test head 6 of a LSI tester, not shown. The probe holding plate 4 is held fixedly on the plate holding member 12.

The testing procedure using the probing plate for wafer testing for testing the electrical characteristics of a semiconductor devices on a wafer will be described hereinafter. The position of the wafer chuck 8 is adjusted by the moving mechanism 9 so that the bonding pads 2 of one or a plurality of semiconductor devices formed on the wafer 1 are brought into contact respectively with the corresponding probes 3 fixed on the probe holding plate 4. The wafer chuck 8 is moved vertically so that the undersurfaces of the bonding pads 2 are in appropriate contact with the corresponding probes 3, respectively. Consequently, the semiconductor devices formed on the wafer 1 are connected electrically through the conductive patterns 5 and the pogo pins 7 of the test head 6 to the LSI tester for signal transmission between the semiconductor devices on the wafer 1 and the LSI tester for testing the electrical characteristics of the semiconductor devices assembled on the wafer 1.

However, since the conventional probing plate for wafer testing employs probes, the diameter of the probes must be reduced according to the reduction in the size and pitch of the bonding pads formed on the wafer, which entails increase in the contact resistance between the bonding pads and the probes. Furthermore, difficulty in manufacturing the probes and in mounting the probes on the probe holding plate is enhanced as the diameter of the probes is reduced. That is, reduction in the size of probes makes it difficult to accurately attach a plurality of minute probes to the probe holding plate so that the probes can be highly accurately positioned relative to a plurality of bonding pads formed on the wafer by precision processes.

A wafer probing unit developed to solve such problems is disclosed in Japanese Patent Laying-Open Gazette No. 162045/1983. This wafer probing unit is shown in FIGS. 10A and 10B. As shown in FIGS. 10A and 10B, in this wafer probing unit, probe fingers 21 are formed in a flat quartz plate 20 by selectively removing portions of the flat quartz plate 20 by photolithographic techniques, and leads 22 for transmitting electric signals from the bonding pads of semiconductor devices to an external equipment are formed on the surfaces of the probe fingers 21 by photolithographic techniques. Metallic needles 23 are fitted in through holes 24 formed near the free ends of the probe fingers 21 and are fixed to the probe fingers 21 and connected electrically to the leads 22 by a conductive adhesive, respectively.

Since the probe fingers are formed simultaneously by photolithographic techniques, the probe fingers 21 are formed in a high positional accuracy. However, processing the free ends of the probe fingers 21 to attach the metallic needles 23 to the probe finger 21 is very difficult.

FIG. 11 shows another conventional wafer probing plate which is disclosed in Japanese Patent Laying-Open Gazette No. 144142/1984. In this wafer probing plate, conductive wiring patterns 32 are formed on both sides of a ceramic plate 30 and are interconnected through through holes. Copper or gold contact pads 33 serving as probes are formed on the conductive wiring pattern 32 for electrical contact with the bonding pads of semiconductor devices. Connecting pins 31 are fixed to one side edge of the ceramic plate 30 and are connected to the conductive wiring pattern 32. The contact pads 33, as well as the conductive wiring patterns 32, can be formed accurately at positions respectively corresponding to those of the bonding pads of the semiconductor devices by a vapor deposition process or a printing process. However, it is difficult to form the copper or gold contact pads 33 on the ceramic plate 30 in a high density so that the contact pads 33 coincide respectively with bonding pads arranged at very small intervals on the order of 30 $\mu$m. Although the height of the contact pads 33 from the surface of the ceramic plate 30 is the thickness of the conductive films forming the contact pads 33, it is difficult to form the conductive films in an accurate thickness so that the contact pads 33 will not come into contact accidentally with the bonding pads of the semiconductor devices other than those to be tested.

SUMMARY OF THE INVENTION

It is an object of the present invention to provide a probing plate for wafer testing, capable of being positioned at a high accuracy relative to the plurality of bonding pads of semiconductor devices formed by minute processing techniques.

It is another objective of the present invention to provide a probing plate for wafer testing having probes which will not accidentally come into contact with the bonding pads of semiconductor devices other than those to be tested.

It is a further object of the present invention to provide a probing plate for wafer testing, capable of being readily manufactured.

It is still a further object of the present invention to provide a probing plate for wafer testing, provided with contact fingers having enhanced elasticity.

A probing plate for wafer testing according to the present invention has a plurality of probes arranged so as to correspond to the plurality of bonding pads of semiconductor devices formed on a semiconductor wafer. The probing plate comprises an electrically insulating base plate having a plurality of contact fingers each having a raised portion in the free end thereof, contact conductors formed over the surfaces of the raised portions of the contact fingers, and wiring conductors formed in a predetermined pattern so as to extend respectively from the contact conductors. A conductive film is formed in a predetermined pattern to form the wiring conductors, which are connected respectively to the contact conductors.

In one aspect of the present invention, portions of an electrically insulating base plate are removed selectively by photolithographic techniques to form contact fingers respectively having raised portions, and arranged at predetermined intervals so as to correspond to the plurality of bonding pads of semiconductor devices; the height of the surfaces of the raised portions of the contact fingers from the major surface of the base plate is greater than the height of the bonding pads of the semiconductor device. Preferably, the raised portions of the base plate are formed in such a height by photolithographic techniques. The base plate may be formed of a photosensitive glass. Terminals to be connected electrically to the contact pins of the wafer prober may be included in the wiring conductors. When the terminals are formed in such a manner, the wiring conductors may include wiring conductors formed on the other surface of the base plate and connected through through holes thereto. Preferably, the surface area size of each contact conductor is smaller than that of the corresponding bonding pad of the semiconductor device.

According to the present invention, the contact conductors are formed over the surfaces of the raised portions of the contact fingers, respectively. Accordingly, only the contact conductors are able to be brought into contact with the corresponding bonding pads of the semiconductor devices to be tested, so that the accidental contact of the contact conductors with bonding pads other than those of the semiconductor devices to be tested is prevented. Since such probe consists of the contact finger having the raised portions of the base plate and the contact conductor, the probes can be formed accurately in the base plate in a high density at minute intervals by photolithographic techniques. Furthermore, the contact conductors and the wiring conductors can be readily formed in an integral conductive layer by photolithographic techniques.

These objects and other objects, features, aspects and advantages of the present invention will become more apparent from the following detailed description of the present invention when taken in conjunction with the accompanying drawings.

BRIEF DESCRIPTION OF THE DRAWINGS

FIGS. 7A, 7B, 7C, 7D, 7E, 7F, 7G, 7H, 7I and 7J are plan views showing different stages of a manufacturing process for manufacturing a probing plate for wafer testing according to the present invention;

FIGS. 8A, 8B, 8C, 8D, 8E, 8F, 8G, 8H, 8I and 8J are sectional views taken on lines VIII—VIII respectively in FIGS. 7A to 7J;

DESCRIPTION OF THE PREFERRED EMBODIMENTS

First Embodiment

Figure 1A:
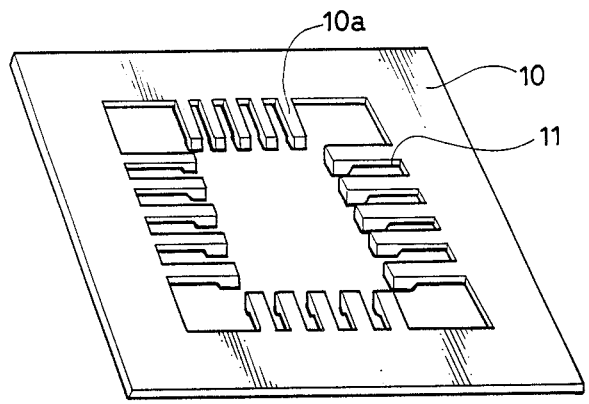
FIG. 1A is a perspective view of a probing plate for wafer testing, in a first embodiment according to the present invention.
Figure 1B:
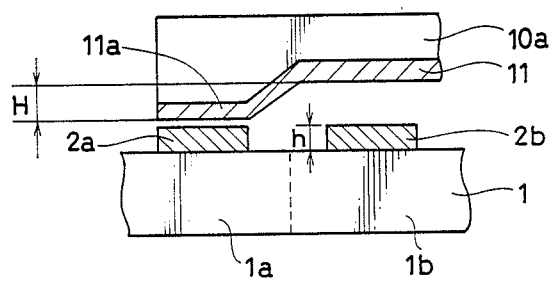
FIG. 1B is an enlarged fragmentary sectional view showing a contact conductor of the probing plate of FIG. 1A.
Figure 1C:
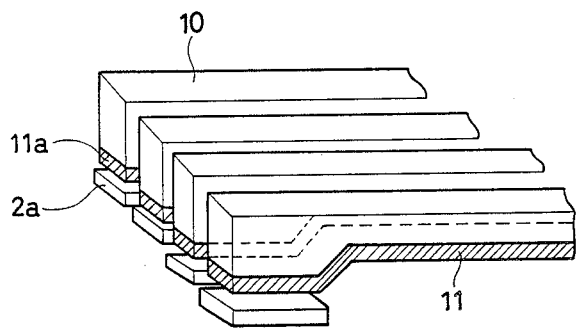
FIG. 1C is an enlarged fragmentary perspective view showing contact conductors of the probing plate of FIG. 1A.

Referring to FIGS. 1A, 1B and 1C showing a probing plate for wafer testing, in a first embodiment according to the present invention, a base plate 10 formed of a photosensitive glass or ceramics, such as alumina, has hundreds of minute contact fingers 10a formed by selectively removing a portion of the central region thereof. In FIG. 1A, only several contact fingers 10a are shown for simplicity. Intervals between the contact fingers 10a are on the order of 30 μm and the width of the contact fingers 10a is on the order of 50 μm, which correspond respectively to the pitches and size of the bonding pads of semiconductor devices to be tested. Metallic wiring conductors 11, such as ITO (Indium Tin Oxide) wiring conductors, are formed over the surfaces of the free ends of the contact fingers 10a, respectively. As shown in FIG. 1B, one side of the free end of each contact finger 10a is raised in a step so that a contact conductor 11a formed over the surface of the step will be in contact only with a bonding pad 2a of a semiconductor device 1a to be tested and will not be in contact with an adjacent bonding pad 2b of other semiconductor device 1b which is not to be tested. That is, the height H of the step is greater than the height h (about 20 μm) of the bonding pads and is on the order of 50 μm or below. The thickness of the base plate 10 is in the range of about 0.5 to about 2.0 mm and the thickness of the metallic wiring conductor 11 is in the range of about 2 to 3 μm. The surface area size of the bonding pads 2a is on the order of 50 μm×50 μm. The surface area size of the contact conductors 11a of the metallic wiring conductors 11 is smaller than that of the bonding pads 2a. The contact fingers 10a and the metallic wiring conductors 11 may be formed by precision photolithographic techniques, which will be described afterward.

Figure 2A:
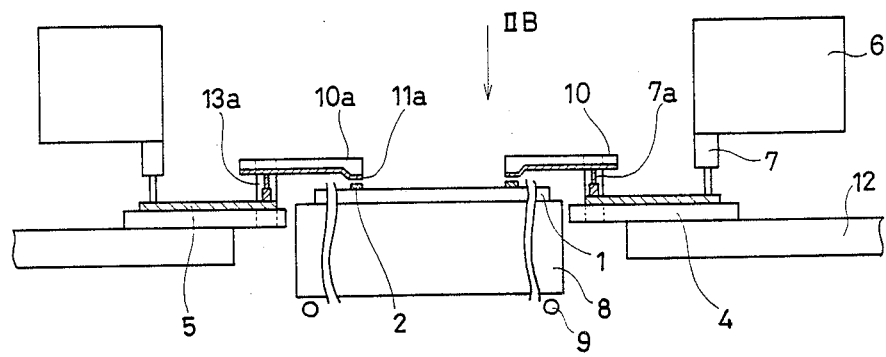
FIG. 2A is a schematic sectional view of a wafer prober employing the probing plate of FIG. 1A and taken on line IIA—IIA in FIG. 2B.
Figure 2B:
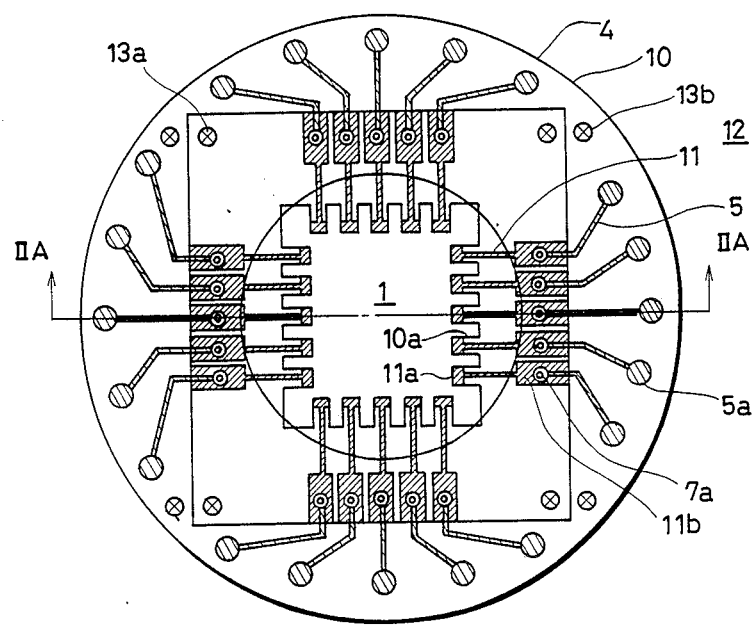
FIG. 2 is a transparent plan view of the wafer prober of FIG. 2A as viewed in the direction of an arrow IIB in FIG. 2A.

Referring to FIGS. 2A and 2B showing a wafer prober employing the probing plate shown in FIGS. 1A and 1B, a wafer 1 carrying a plurality of LSIs thereon is fixedly mounted on a wafer chuck 8. The wafer chuck 8 can be moved vertically and horizontally by a moving mechanism 9 to position bonding pads 2 arranged on the wafer 1 relative to the corresponding contact fingers 10a of the base plate 10 disposed above the wafer chuck 8. The base plate 10 having the contact fingers 10a is fastened with screws 13a to a probing plate holding plate 4 formed of an insulating material, such as glass or an epoxy resin. The metallic wiring conductors 11 formed in a predetermined pattern on one surface of the base plate 10 interconnect electrically the contact conductors 11a, which come into contact with the corresponding bonding pads 2, and terminal conductors 11b, which are brought into electrical contact with pogo pins 7a, respectively. The pogo pins 7a are fixed by soldering or suitable means to metallic wiring conductors 5 formed of copper or the like in a predetermined pattern on the probing plate holding plate 4. Metallic terminal pads 5a respectively connected to the metallic wiring conductor 5 are in electrical contact with pogo pins 7 of the test head 6 of a LSI tester, not shown. The probing plate holding plate 4 is fastened with screws 13b to a holding member 12 of the wafer prober.

In the wafer prober thus constructed, electric signals are transmitted between the semiconductor devices fabricated on the wafer 1, and the LSI tester through the following paths. Each bonding pad 2 is in contact with the contact conductor 11a, which in turn is connected electrically through the wiring conductor 11 to the terminal conductor 11b. The terminal conductor 11b is connected electrically through the pogo pin 7a to the wiring conductor 5 and the contact pad 5a formed on the probing plate holding plate 4. The contact pad 5a formed on the probing plate holding plate 4. The contact pad 5a is connected electrically through the pogo pin 7 of the test head 6 to the LSI tester.

As shown in FIG. 2B, the extremities of the metallic wiring conductors 11 formed on the base plate 10 are expanded to form the contact conductors 11a, which are brought into contact with the bonding pads, and the terminal conductors 11b, which are brought into contact with the pogo pins 7a fixed to the probing plate holding plate 4. Accordingly, the contact conductors 11a and terminal conductors 11b of the metallic wiring conductors are able to be brought into electrical contact securely with the corresponding bonding pads 2 and the corresponding pogo pins 7a, respectively. Similarly, the metallic wiring conductors 5 are connected securely with the pogo pins 7 of the test head 6 of the LSI tester through the electrical contact of the contact pads 5a formed by expanding one end of each metallic wiring conductor 5. In this embodiment, the wafer 1 is 6 to 8 in. (152.4 to 203.2 mm) in diameter. The distance between the opposite contact fingers 10a of the probing plate, namely, the distance between the two bonding pads 2 of an objective circuit, is on the order of 10 mm.

Second Embodiment

Figure 3:
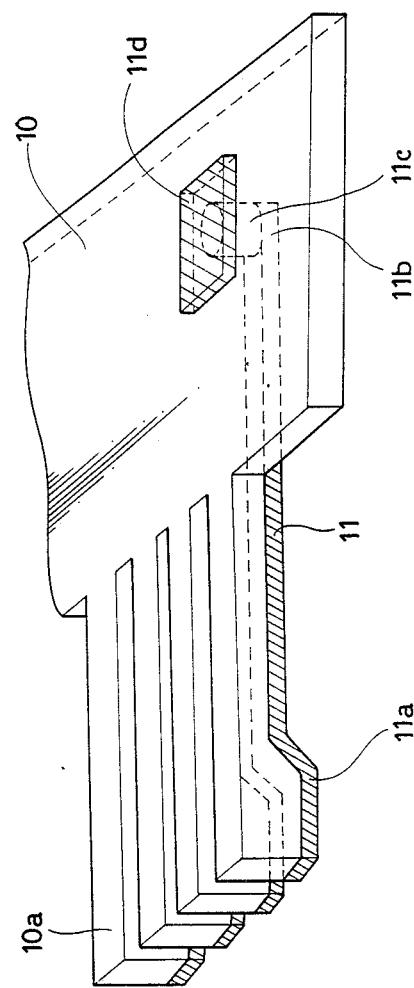
FIG. 3 is a perspective view of an enlarged fragmentary perspective view of a probing plate for wafer testing, in a second embodiment according to the present invention,; P

Referring to FIG. 3, an insulating base plate 10 formed of a photosensitive glass or ceramics is provided with through holes 11c, and metallic terminal pads 11d are formed over the through holes 11c, respectively. Metallic wiring conductors 11 are formed on one surface of the base plate 10. Contact conductor 11a is formed at one end of each metallic wiring conductor 11. The metallic wiring conductors 11 are connected by conductive layers formed over the inner surfaces of the through holes 11c to the terminal pads 11d. Thus, the contact conductors 11a, which are brought into contact with bonding pads 2, are connected electrically to the terminal pads 11d.

Figure 4A:
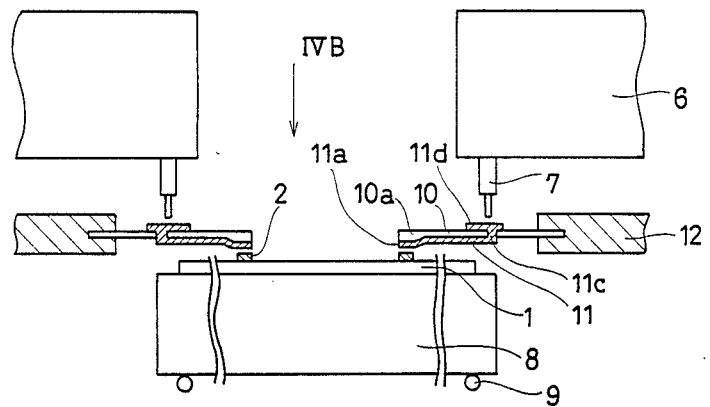
FIG. 4A is a schematic sectional view of the wafer prober employing the probing plate of FIG. 3 and taken on line IVA—IVA in FIG. 4B.
Figure 4B:
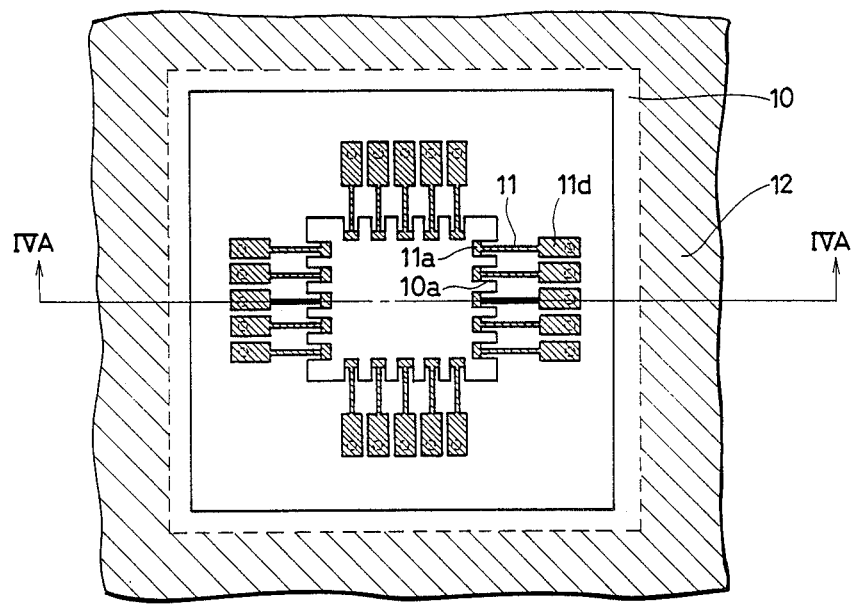
FIG. 4B is a transparent plan view of the wafer prober of FIG. 4A as viewed in the direction of an arrow IVB.

Electric signal transmission paths between the bonding pads 2 and pogo pins 7 provided on the test head 6 of a LSI tester, not shown, will be described with reference to FIGS. 4A and 4B showing a wafer prober employing the probing plate in the second embodiment. The bonding pads 2 arranged on a wafer 1 fixedly held on a wafer chuck 8 are brought into contact with the contact conductors 11a of the metallic wiring conductors 11 formed on contact fingers 10a. The contact conductors 11a are connected through the metallic wiring conductors 11 and the conductive layers formed over the inner surfaces of the through holes 11c to the terminal pads 11d, respectively. The terminal pads 11d are in contact with the pogo pins 7 of the LSI tester.

Figure 5A:
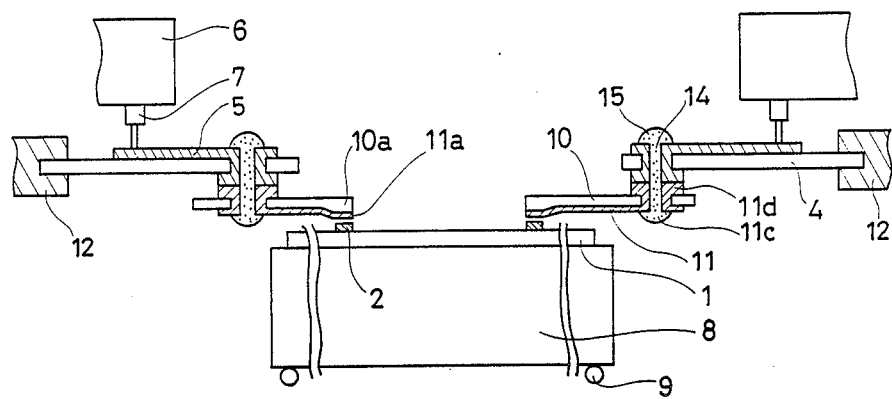
FIG. 5A is a schematic sectional view of another wafer prober employing the probing plate of FIG. 3.
Figure 5B:
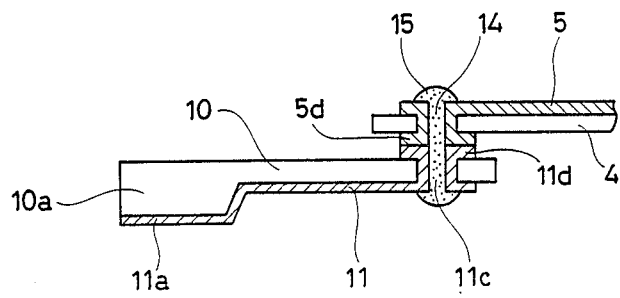
FIG. 5B is an enlarged fragmentary sectional view showing part of FIG. 5A.

Shown in FIGS. 5A and 5B is another wafer prober employing the probing plate having the through holes 11c shown in FIG. 3. This wafer prober differs from that shown in FIG. 4A in that the wafer prober has a probing plate holding plate 4 provided with through holes 14. The base plate 10 are placed so that the through holes 11c are aligned respectively with the through holes 14 of the probing plate holding plate 4, and the through holes 11c and 14 are filled with solder 15. Metallic wiring conductors 5 formed on one surface of the probing plate holding plate 4 are connected respectively to metallic wiring conductors 5d formed on the other surface of the same by the solder 15 filling the through holes 14. The terminal pads 11d formed on the surface of the base plate 10 facing the probing plate holding plate 4 are joined to the metallic wiring conductors 5d, respectively, so that the metallic wiring conductors 11 are connected electrically to the metallic wiring conductors 5.

Third Embodiment

Figure 6A:
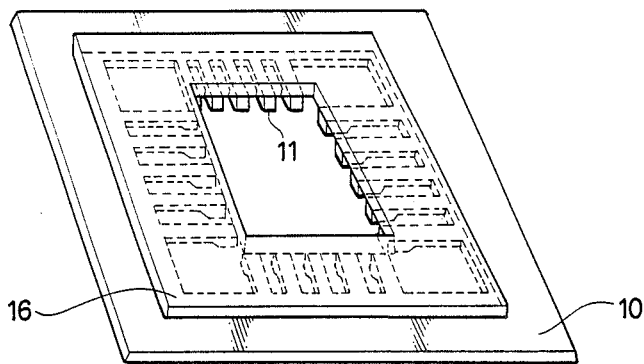
FIG. 6A is a perspective view of a probing plate for wafer testing, in a third embodiment according to the present invention.
Figure 6B:
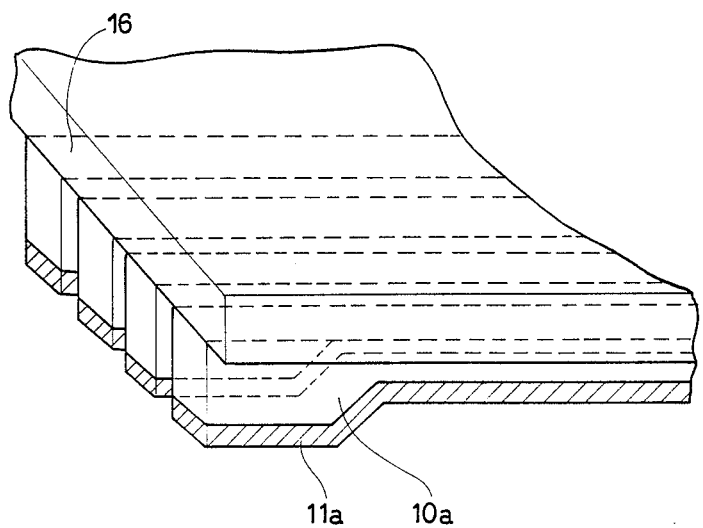
FIG. 6B is an enlarged fragmentary perspective view of the probing plate of FIG. 6A.

Referring to FIGS. 6A and 6B, an elastic thin plate 16, such as a thin aluminum plate, is placed on one surface of a base plate 10 formed of a photosensitive glass or ceramics, and the elastic thin plate 16 and the base plate 10 are bonded together to reinforce the base plate 10 and to enhance the elasticity of the probing plate. An opening is formed in the central region of the elastic thin plate 16 so at to coincide substantially with an opening formed in the base plate 10.

A process of manufacturing the probing plate for wafer testing shown in FIG. 3 will be described hereinafter with reference to FIGS. 7A to 7J and 8A to 8J on an assumption that the base plate 10 is formed of a photosensitive glass, in which only to contact fingers are shown for simplicity.

First, as shown in FIGS. 7A and 8A, a mask 17 is formed over one of the polished surfaces of a photosensitive glass plate 100 sensitive to ultraviolet (hereinafter abbreviated to "UV") radiation. The mask 17 has UV permeable regions 171. The surface of the photosensitive glass plate 100 coated with the mask 17 is exposed to UV radiation traveling in the direction of arrows.

Secondly, as shown in FIGS. 7B and 8B, the photosensitive glass plate 100 is subjected to a heat treatment. Then, only portions of the photosensitive glass plate 100 exposed to UV radiation, namely, portions in which latent images are formed, are crystallized by the heat treatment. When heated in the heat treatment, a metallic colloid is produced in the exposed portions, and the crystallization is induced by the metallic colloid. Crystalline portions 101 thus crystallized are formed in the portions exposed to UV radiation. The crystalline portions 101 have very fine structure and are soluble in an acid solution.

Then, as shown in FIGS. 7C and 8C, the crystalline portions 101 are dissolved and removed by an acid solution (an etching solution) to form the contact fingers and the through holes 11c.

Then, as shown in FIGS. 7D and 8D, a mask 18 having a UV permeable portion 181 is formed over the surface of the photosensitive glass plate 100, and then the photosensitive glass plate 100 is exposed to UV radiation.

Figure 7E:
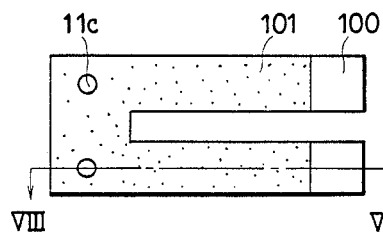
Figure 8E:
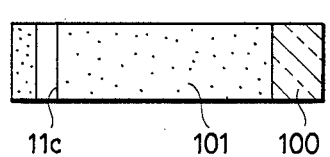

Then, as shown in FIGS. 7E and 8E, only a portion exposed to UV radiation, namely, a portion in which a latent image is formed, is crystallized in a crystalline portion 101 by a predetermined heat treatment.

Figure 7F:
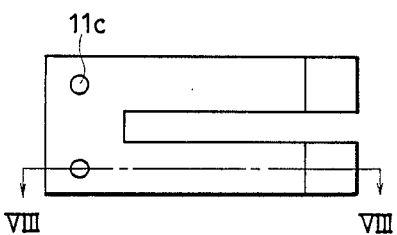
Figure 8F:

Then, as shown in FIGS. 7F and 8F, the crystalline portion 101 is etched by an etching acid solution for an appropriate time to remove the crystalline portion 101 partially by a predetermined depth to form raised portions on the contact fingers 10a.

Figure 7G:
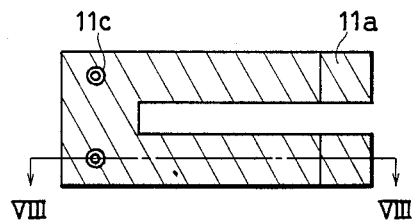
Figure 8G:
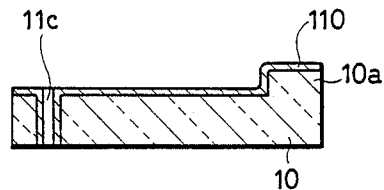

Then, as shown in FIGS. 7G and 8G, the surface of the base plate 10 is coated with a metallic film 110, such as an ITO (Indium Tin Oxide) film, by electroless plating.

Figure 7H:
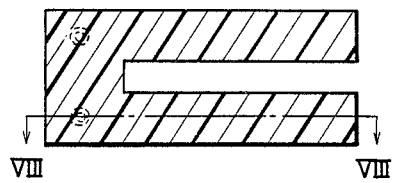
Figure 8H:
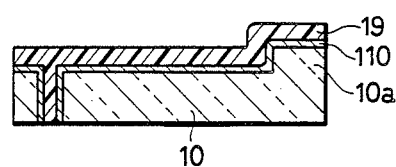

Then, as shown in FIGS. 7H and 8H, a resist film 19 is formed in a predetermined pattern over the metallic film 110.

Figure 7I:
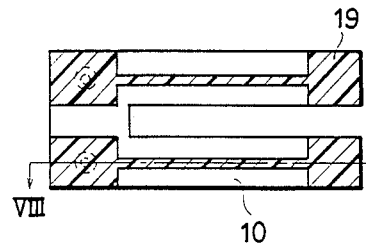
Figure 8I:
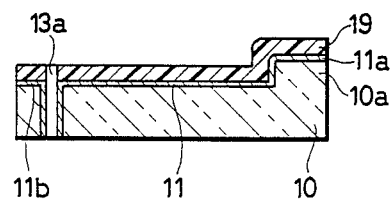

Then, as shown in FIGS. 7I and 8I, portions of the metallic film 110 are removed selectively by a photolithographic process using the resist film 19 as a mask to form the contact conductors 11a to be brought into contact respectively with bonding pads, the metallic wiring conductors 11 respectively extending from the contact conductors 11a, and the terminal conductors 11b to be brought into contact with the pogo pins.

Figure 7J:
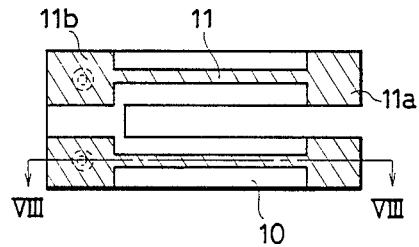
Figure 8J:
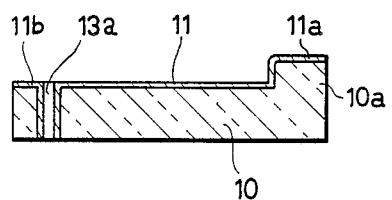
Figure 9B:
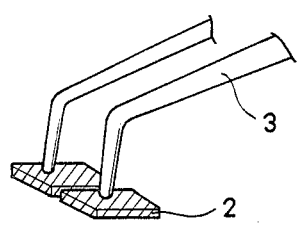
FIG. 9B is an enlarged fragmentary perspective view showing probes of the probing plate of FIG. 9A.
Figure 9A:
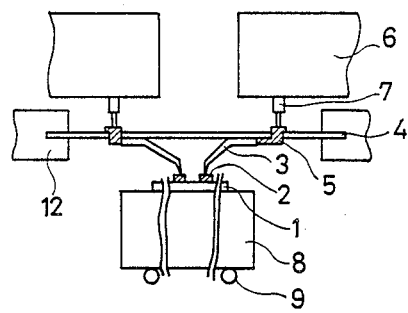
FIG. 9A is a schematic sectional view of a wafer prober employing a conventional probing plate for wafer testing.
Figure 10A:
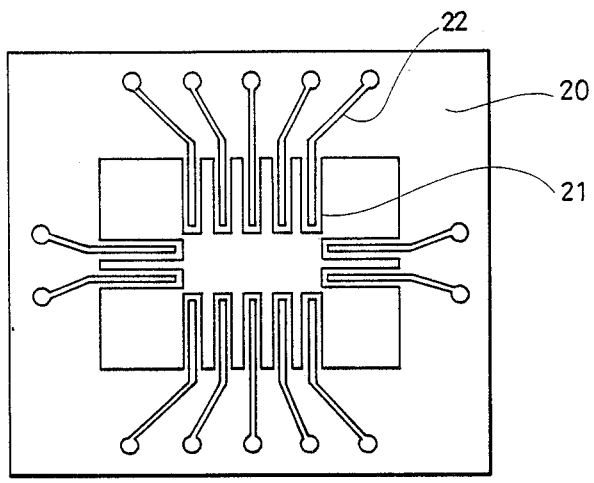
FIG. 10A is a plan view of an exemplary probing plate for wafer testing of a prior art.
Figure 10B:
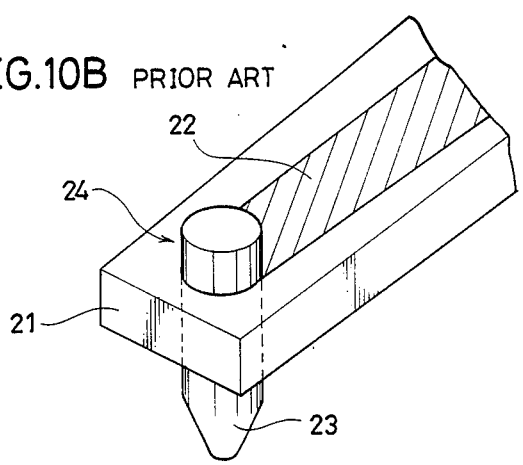
FIG. 10B is an enlarged fragmentary perspective view showing the extremity of a probe of the probing plate of FIG. 10A.
Figure 11:
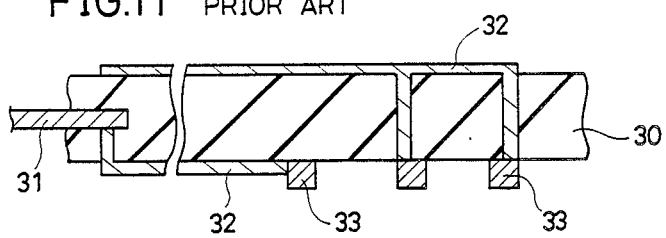
FIG. 11 is a fragmentary sectional view of a probing plate for wafer testing of another prior art.

Then, as shown in FIGS. 7J and 8J, the resist film 19 is removed. The metallic wiring conductors on the other surface of the base plate 10 opposite the surface on which the metallic wiring conductors 11 are formed in a process similar to that described hereinbefore with reference to FIGS. 7G to 7J and 8G to 8J.

As is apparent from the foregoing description, according to the present invention, contact conductors of a probing plate for wafer testing to be brought into contact with bonding pads of objective semiconductor devices are formed in raised portions of contact fingers formed in an insulating base plate. Accordingly, accidental contact of the contact conductors with bonding pads other than the objective bonding pads can be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A probing plate for wafer testing having a plurality of probes arranged so as to correspond to a plurality of bonding pads of semiconductor devices fabricated on a semiconductor wafer, comprising:
    an electrically insulating base plate having raised portions formed at predetermined positions in the major surface thereof;
    contact conductors of a conductive film formed over the surfaces of said raised portions and serving as portions of said probes, respectively; and
    wiring conductors formed integrally with said contact conductors over the major surface of said base plate in a predetermined pattern so as to extend respectively from said contact conductors,
    wherein said raised portions are formed respectively at distal ends of contact fingers formed by removing portions of said base plate selectively by a photolithographic process so as to extend at predetermined intervals and correspond to said plurality of bonding pads.

2. A probing plate for wafer testing according to claim 1, wherein:
    the height of the surfaces of the raised portions with respect to the major surface of said base plate is greater than the height of the bonding pads of the semiconductor devices.

3. A probing plate for wafer testing according to claim 1, wherein:
    said base plate comprises a photosensitive glass material.

4. A probing plate for wafer testing according to claim 1, wherein:
    said base plate includes an elastic plate.

5. A probing plate for wafer testing according to claim 1, wherein:

said wiring conductors include terminal conductors to be connected electrically to contact pins of a wafer prober.

6. A probing plate for wafer testing according to claim 5, wherein:

said wiring conductors include wiring conductors that are formed on the surface of said base plate opposite the major surface and are connected to the wiring conductors formed on the major surface through conductive layers formed over the inner surfaces of through-holes in the base plate, respectively.

7. A probing plate for wafer testing according to claim 1, wherein:

said wiring conductors include contact conductors to be connected electrically through wiring conductors formed on a plate holding said probing plate to correspondingly disposed contact pins of a wafer prober.

8. A probing plate for wafer testing according to claim 1, wherein:

the surface areas of said contact conductors are smaller than the areas of the corresponding bonding pads of the semiconductor devices.

* * * * *